United States Patent [19]

Neugebauer, deceased et al.

[11] Patent Number: 5,384,691
[45] Date of Patent: Jan. 24, 1995

[54] HIGH DENSITY INTERCONNECT MULTI-CHIP MODULES INCLUDING EMBEDDED DISTRIBUTED POWER SUPPLY ELEMENTS

[75] Inventors: Constantine A. Neugebauer, deceased, late of Schenectady, N.Y., by Martha M. Neugebauer, executrix; Charles S. Korman, Schenectady, N.Y.; David A. Bates, Fayetteville, N.Y.; William H. Bicknell, Ballston Lake, N.Y.; Wolfgang Daum, Schenectady, N.Y.

[73] Assignee: General Electric Company, Schenectady, N.Y.

[21] Appl. No.: 2,374

[22] Filed: Jan. 8, 1993

[51] Int. Cl.⁶ ............................................. H05K 7/02
[52] U.S. Cl. .................................. 361/794; 257/700; 361/761; 363/21; 363/147; 439/74
[58] Field of Search ................... 257/668, 700; 363/21, 363/147; 174/250, 260, 254; 439/67, 74, 77; 361/749, 750, 760, 761, 764, 767, 768, 776, 784, 789, 792, 794, 795

[56] References Cited

U.S. PATENT DOCUMENTS

| | | | |
|---|---|---|---|
| 3,994,430 | 11/1976 | Cusano et al. | 228/122 |
| 3,996,603 | 12/1976 | Smith | 357/80 |
| 4,714,516 | 12/1987 | Eichelberger et al. | 156/628 |
| 4,764,485 | 8/1988 | Loughran et al. | 437/225 |
| 4,780,177 | 10/1988 | Wojnarowski et al. | 156/643 |
| 4,783,695 | 11/1988 | Eichelberger et al. | 357/65 |
| 4,835,704 | 5/1989 | Eichelberger et al. | 364/490 |
| 4,842,677 | 6/1989 | Wojnarowski et al. | 156/643 |
| 4,862,129 | 8/1989 | Roshen et al. | 336/61 |
| 4,894,115 | 1/1990 | Eichelberger et al. | 156/643 |
| 4,959,630 | 9/1990 | Yerman et al. | 336/83 |
| 5,017,902 | 5/1991 | Yerman et al. | 336/83 |
| 5,018,051 | 5/1991 | Yamada | 361/764 |
| 5,126,715 | 6/1992 | Yerman et al. | 336/183 |
| 5,173,844 | 12/1992 | Adachi | 361/414 |
| 5,200,810 | 4/1993 | Wojnarowski et al. | 361/398 |
| 5,255,431 | 10/1993 | Burdick | 29/840 |

Primary Examiner—Gerald P. Tolin
Attorney, Agent, or Firm—Brian J. Rees; Geoffrey H. Krauss

[57] ABSTRACT

By employing High Density Interconnect (HDI) multi-chip modules (MCMs) having elements of a distributed power supply embedded in the MCM itself, the functions of an MCM and a power converter are combined. The embedded power supply elements include DC-DC or AC-DC converters to convert an input voltage and input current to a relatively lower output voltage and relatively higher output current, thereby decreasing the current requirements of external power supply lines connected to the multi-chip module. The current and voltage outputs may be connected to chip power inputs through relatively short, low-impedance power distribution conductors comprising copper strips direct bonded to a ceramic substrate; alternatively, or in combination with direct bonded copper conductors, the low-impedance power distribution conductors may be situated within an HDI overcoat structure. The power supply elements may be placed within cavities formed in the substrate, or on a thinner portion of the substrate. The power supply may also provide multiple output voltages.

7 Claims, 9 Drawing Sheets

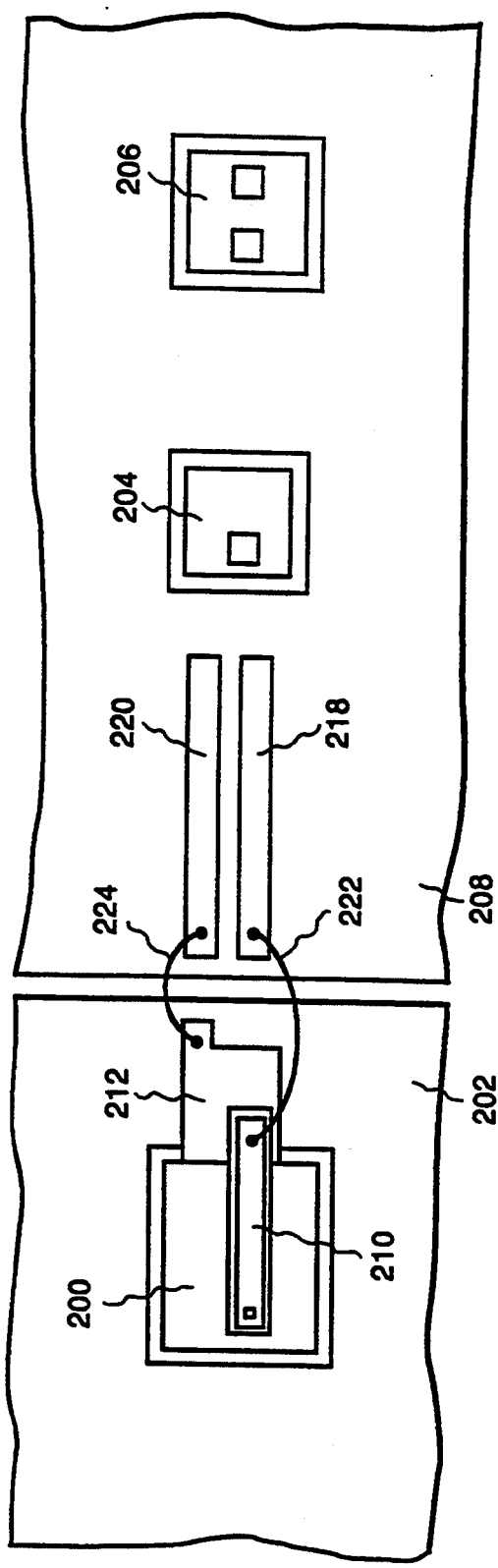
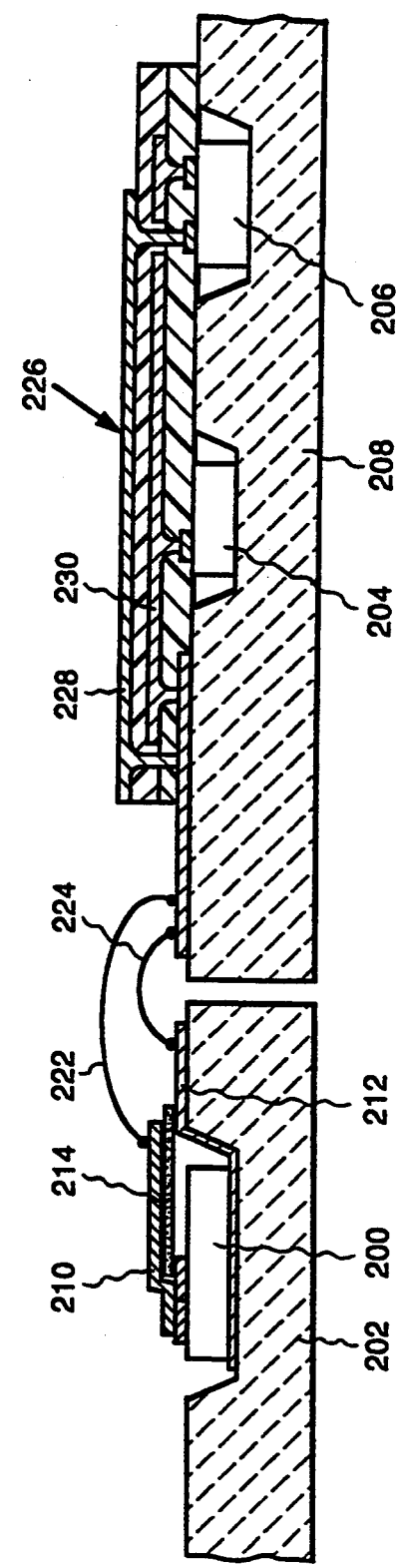
FIG. 7A
FIG. 7B

HIGH DENSITY INTERCONNECT MULTI-CHIP MODULES INCLUDING EMBEDDED DISTRIBUTED POWER SUPPLY ELEMENTS

BACKGROUND OF THE INVENTION

The present invention relates generally to the field of integrated circuit packaging and, more particularly, to multi-chip modules (MCMs) including embedded distributed power supply elements.

Integrated circuits (ICs), including signal ICs and microwave ICs are, to an ever increasing degree, being constructed employing various forms of multi-chip module (MCM) technology, including high density interconnect (HDI) technology. In an MCM, many chips, perhaps as many as one hundred, are interconnected in close proximity to each other.

The current requirements of such MCM are relatively great, for at least three reasons. First, in general, the power requirements of high performance chips are high. Second, operation at higher frequencies requires higher energies to switch semiconductor devices while driving the output capacitance. The power required is proportional to frequency. Third, integrated circuit chips inherently operate at relatively low voltages. Accordingly, for a given power level, the current required is relatively high, since power is equal to the product of voltage and current.

An integrated circuit might have as many as 20% of its input/output (IO) pads devoted to power and ground. Each of these pads must be connected to a current supply line, preferably at low inductance to minimize L(dI/dt) switching transients. Correspondingly, a typical prior art MCM will have many relatively high-inductance power supply and ground pins connected electrically in parallel in an effort to achieve an overall low impedance.

MCMs are increasingly being constructed employing a variety of integrated circuit and discrete components which represent differing technologies, such as complementary metal-oxide-semiconductor (CMOS), emitter coupled logic (ECL) silicon, and GaAs. Each technology has different voltage and current requirements. In the conventional approach, all power requirements are met by external power supplies and brought separately into the module through multiple pins. As power requirement become higher, more pins are required. However, pins are in short supply.

A particularly advantageous form of multi-chip module is a high density interconnect (HDI) structure which has been developed by General Electric Company. As disclosed in commonly-assigned Eichelberger et al. U.S. Pat. No. 4,783,695, issued Nov. 8, 1988, and related patents, the HDI structure offers many advantages in the compact assembly of digital and other electronic systems. For example, an electronic system which incorporates between thirty and fifty chips, or even more, can be fully assembled and interconnected on a single substrate which is fifty mm (two inches) long by fifty mm (two inches) wide by 1.27 mm (fifty mils) thick. One advantage of this HDI structure is that it provides a good heat sink for integrated circuit chips, including power and microwave chips, since an alumina substrate is employed. Further, as disclosed, for example, in commonly-assigned W. Kornrumpf et al. application Ser. No. 07/504,821, filed Apr. 5, 1990, now abandoned in favor of continuation application Ser. No. 07/869,090, filed Apr. 14, 1992, and allowed and entitled "HDI Microwave Circuit Assembly", the utility of the HDI structure has been extended from digital technology into the microwave regime.

Very briefly, in the manufacture of systems employing this HDI structure, individual cavities (or one large cavity) having appropriate depths at the intended locations of the various chips are formed in a component-supporting surface of the ceramic substrate. The various chips and other components are placed in their desired locations within the cavities, and adhesively attached.

At this stage, the upper surfaces of all components and portions of the substrate component-supporting surface are disposed in substantially a common plane. A multi-layer high density interconnect (HDI) overcoat structure including interleaved layers of dielectric material and metallized conductive material is then built up to electrically interconnect the components into a functioning system.

In previous systems employing HDI technology, the HDI overcoat structure typically does not extend all the way to the outer edge of the substrate component-supporting surface. Rather, the HDI overcoat structure terminates just inside a row of contact pads to which external connections are subsequently made, such as by ultrasonic wire bonding, when the system is finally assembled into a suitable leaded package. These contact pads are formed directly on portions of the substrate surface surrounding the cavities, and are electrically connected through suitable vias within the HDI overcoat structure to lower metallization layers of the HDI overcoat structure.

Power and ground plane metallization is also deposited directly on the ceramic substrate in some designs, for example to contact the back sides of the IC chips. (Metallization deposited or otherwise formed directly on the ceramic substrate, as opposed to metallization layers within the HDI overcoat structure, is referred to as "metal zero".) In some structures, power and ground plane layers are included in the HDI overcoat structure.

SUMMARY OF THE INVENTION

Accordingly, it is an object of the invention to effectively fulfill the power supply requirements of multi-chip modules, particularly multi-chip modules employing an HDI structure.

It is another object of the invention to facilitate the extension of HDI technology into the analog and microwave regimes, including radar applications.

Briefly stated, and in accordance with an overall aspect of the invention, certain power supply elements are embedded in the multi-chip module itself. The embedded power supply elements for example include DC-DC converters which convert an input voltage and an input current to a relatively lower output voltage and a relatively higher output current. Alternatively, the embedded power supply elements may include AC-DC converters. In either event, the current requirements of the external power supply lines connected to the multi-chip module are decreased, which external power supply lines accordingly operate at relatively higher voltages. This arrangement greatly reduces the number of power supply and ground pins supplying power to the module, and eases the requirement to connect an external power supply to the module through low-impedance conductors. The relatively higher current and lower voltage power supply output is connected to chip power inputs through relatively short, low-impedance power-distribution conductors.

These low-impedance power distribution conductors may comprise copper strips bonded to the ceramic substrate, for example by means of a direct bond copper (DBCu) process. Alternatively, or in combination with DBCu conductors, the low-impedance power distribution conductors may comprise conductors, within the HDI overcoat structure.

The power supply elements are included in a module substrate, and may be placed within cavities formed in the substrate, in the manner of other components.

In general, the embedded power supply can either be fabricated on the same substrate which acts as a base for the MCM, or can be fabricated on a separate drop-in substrate for which space is allocated within the MCM. In either case, the technology used to fabricate the power conversion electronics should match the height form factor of the MCM, which can vary from 0.1 to 0.2 inches. Multiple power outputs from the embedded power converter are routed to the various semiconductor devices and other components through an optimum (with respect to power loss and inductance) distribution network fabricated using a metallization process consistent with the particular MCM fabrication process employed.

The invention thus merges copper/ceramic (such as DBCu) and HDI technologies, using a single or multilayer DBCu substrate as a base for HDI construction. Preferably, a DBCu substrate for efficient power handling is combined with HDI technology to minimize the required area or "footprint", particularly of a power converter control section, and to provide a convenient technique for interconnecting to the rest of the MCM. Thus, an HDI overlayer can act as a flexible harness to couple power to individual integrated circuits within the MCM. Alternatively, power distribution and connections can be made using either HDI metal zero (or DBCu), or a separate layer within a multilayer DBCu substrate.

In addition, the invention enables a switching power supply to be embodied within an MCM in a manner which does not adversely impact the MCM profile, enables the MCM to be powered from a single voltage standard power bus (such as a 50 volt bus) by providing multiple voltage conversions internal to the MCM, and can be fabricated using technology similar to MCM fabrication technology.

BRIEF DESCRIPTION OF THE DRAWINGS

While the novel features of the invention are set forth with particularity in the appended claims, the invention, both as to organization and content, will be better understood and appreciated from the following detailed description, taken in conjunction with the drawings, in which:

FIG. 7A is a plan view with the HDI overcoat structure omitted and FIG. 7B is a cross section with the HDI overcoat structure present, both figures depicting in general another form of interconnection between the control elements of a power supply and the power-handling components, or between a power supply substrate and another substrate, employing wire bonds;

DETAILED DESCRIPTION

Figure 1:
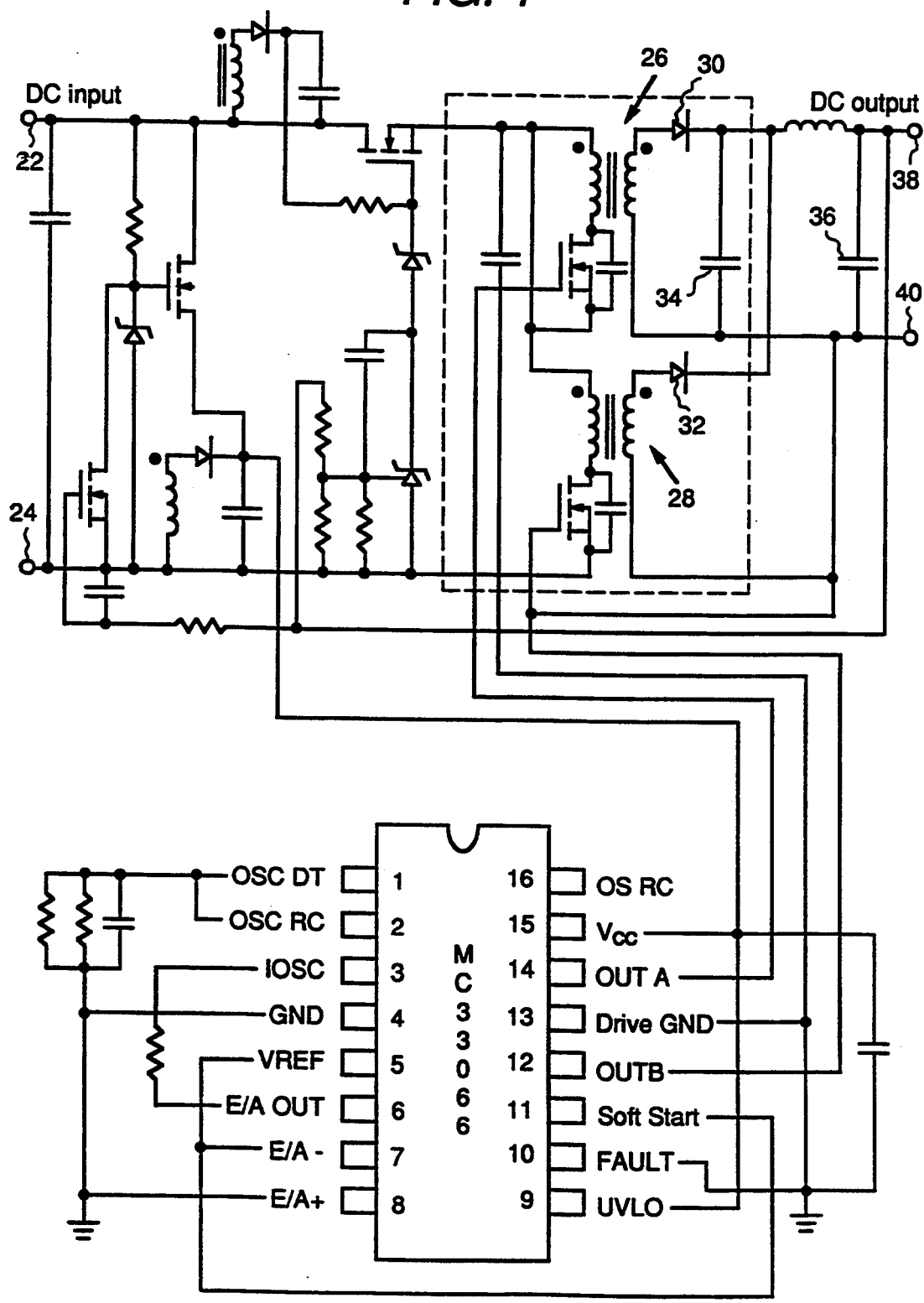
FIG. 1 is an electrical schematic diagram of a representative switching power supply such as may be embodied in the structures of the subject invention.
Figure 2:
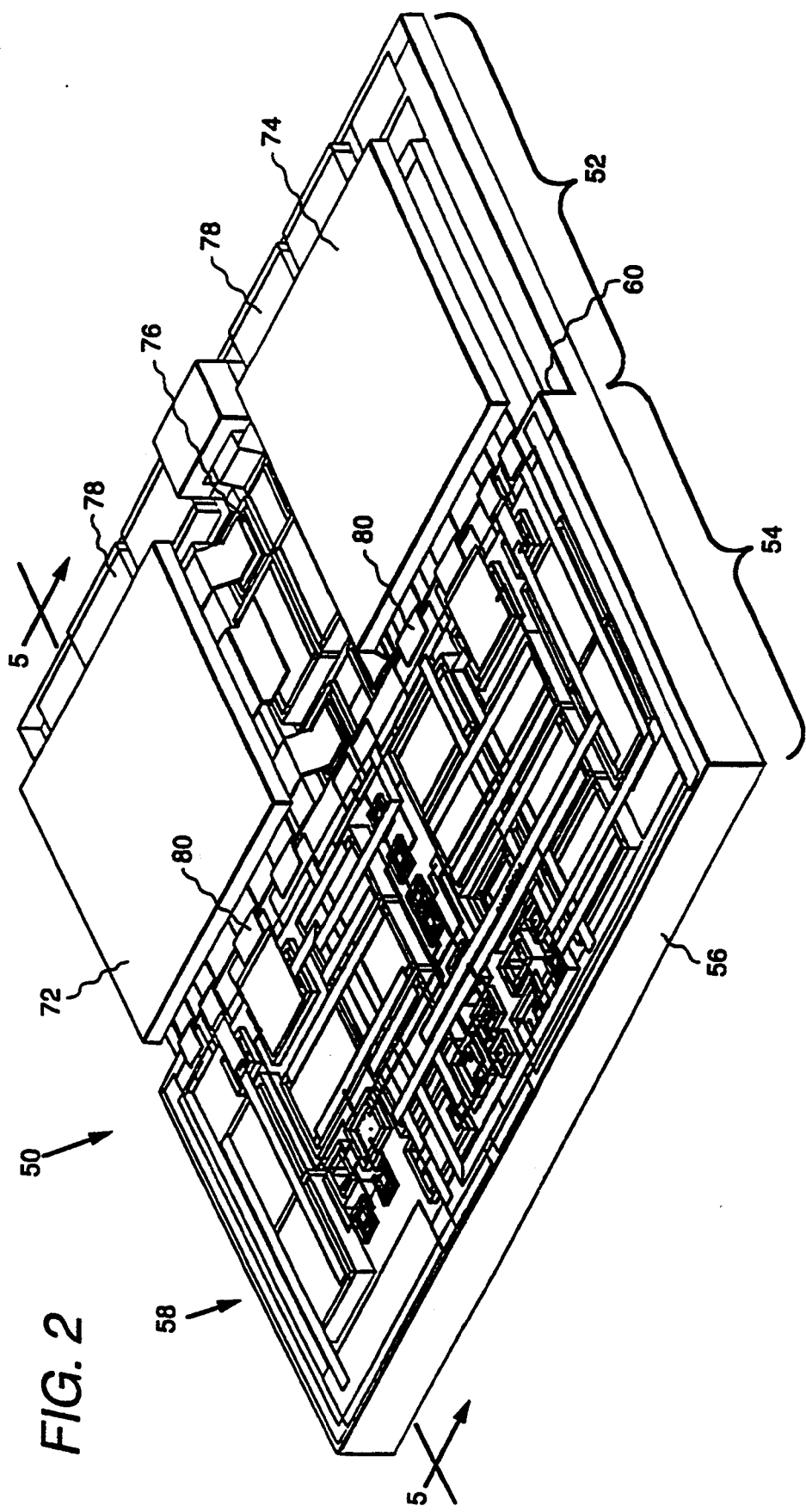
FIG. 2 is a three-dimensional overview of an implementation of the FIG. 1 power supply circuit.
Figure 3:
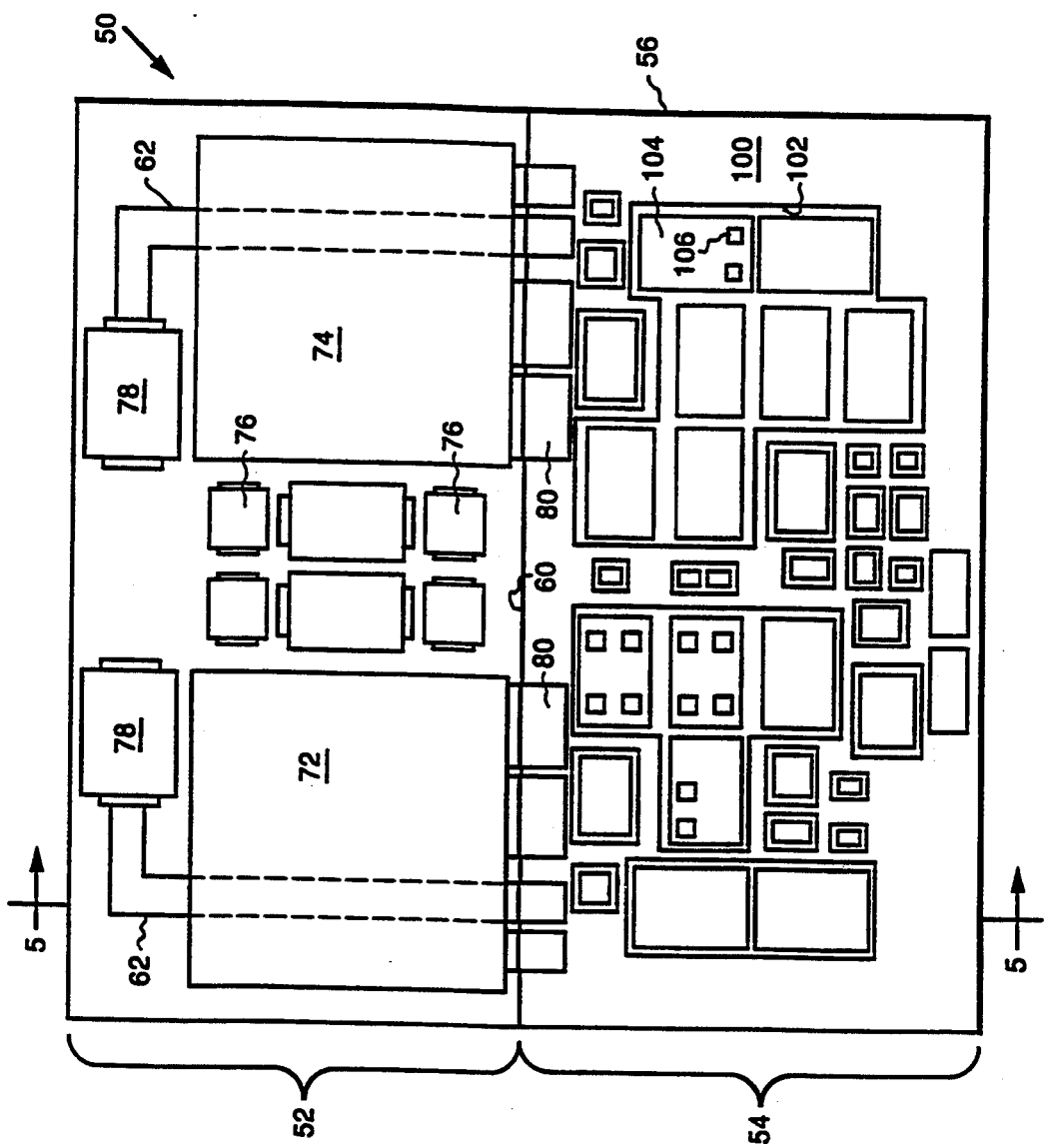
FIG. 3 is a plan view corresponding to FIG. 2, but with the HDI overcoat structure omitted for purposes of illustration.
Figure 4:
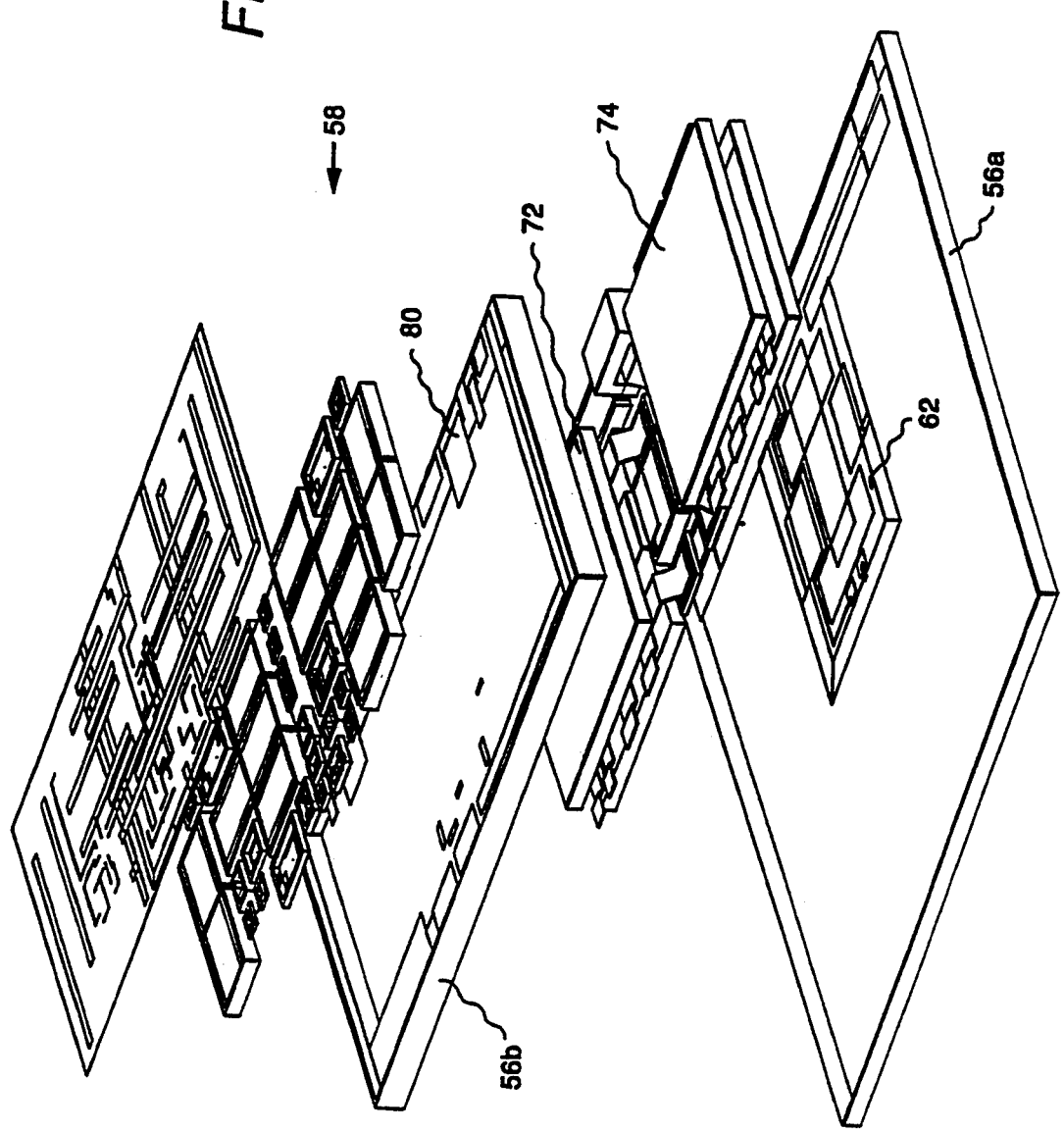
FIG. 4 is an exploded view of the structure of FIGS. 2–3.

FIG. 1 is an electrical schematic diagram of a representative general-purpose power supply circuit which is suitable for both computer (+5 volt transistor-transistor logic (TTL)) and radar (+9 volt pulsed) applications. The FIG. 1 power supply circuit may, for example, be implemented as a fifty watt power supply having input terminals 22 and 24 to which a DC input voltage of approximately fifty volts at 1.0 amp is applied.

This particular circuit has been selected (although other circuits could be selected) because it can be constructed using a minimum number of parts and still provide input-to-output isolation and satisfactory voltage regulation when supplied from a fixed DC input source, consistent with conditions for a DC distributed power system.

As just noted, the particular power supply circuit of FIG. 1 is representative only, and is not described in detail herein, except to note that the components thereof may be categorized generally into power-handling components and control elements. The individual power-handling components are relatively large compared to the control element components. The power-handling components include transformers 26 and 28, rectifier diodes 30 and 32, and filter capacitors 34 and 36. The FIG. 1 power supply provides a DC output voltage, for example five volts, across a pair of output terminals 38 and 40, and can provide an output current of, for example, ten amps.

It will be appreciated that, in applications where multiple output voltages are required, appropriate portions of the FIG. 1 power supply circuit are simply duplicated as necessary. One of the features of the invention is that a switching power supply can be embodied in an MCM such that the MCM can be powered from a single voltage standard power bus (such as a 50 volt bus), with multiple voltage conversions being provided internally to the MCM.

FIGS. 2, 3, 4 and 5 together depict an actual implementation 50 of the FIG. 1 power supply circuit, employing a hybrid approach combining direct bond copper (DBCu) and high density interconnect (HDI) technology. The implementation is generally organized into a power component portion 52 and a control element portion 54. The implementation of FIGS. 2–5 is a presently-preferred approach where the entire power supply is fabricated on a single substrate 56, approximately two inches square. However, in some implementations, two individual substrates may be employed. As may be seen in FIGS. 2, 4 and 5, an HDI overcoat structure 58 comprises a multilayer interconnect structure. (The HDI overcoat structure is omitted in the plan view of FIG. 3 for clarity of illustration.)

Power supply 50 may be constructed with a total height on the order of 0.1 inch, including transformers, and can be fabricated using fabrication technology compatible with MCM modules. This consistent fabrication technology and form factor allow the power supply implementation to be embedded into an MCM.

Considering the power supply implementation of FIGS. 2–5 in greater detail, substrate 56 may comprise alumina ($Al_2O_3$), beryllia (BeO) or aluminum nitride (AlN). In view of the relatively thicker components in the power component portion 52 as are described hereinbelow, the power component portion of substrate 56 is made thinner than the control element portion 54, with a step at 60. In practice, this may be achieved by beginning with a base substrate having a thickness corresponding to that of the power component portion 52, and applying another ceramic layer to build up the control element portion 54 to its full height. The ceramic substrate is then cofired to effectively join the layers, resulting in step 60 evident in FIGS. 2 and 5. (In the exploded view of FIG. 4, substrate 56 is represented as two constituent layers 56a and 56b prior to being cofired.) Alternatively, cavities of appropriate depths can be milled into a substrate blank initially of uniform thickness to allow taller components to be recessed.

In general, the power-handling component portion 52 is fabricated employing direct bond copper (DBCu) technology including a plurality of copper conductive traces, such as representative traces 62 (not visible in FIG. 2) direct bonded to substrate 56. The direct bond copper process is disclosed, for example, in D. Cusano et al. U.S. Pat. No. 3,994,430 issued Nov. 30, 1976. As an example, DBCu conductors 62 may have a thickness of 8 mils. In general, the power-handling section 52 resembles a printed circuit board with copper conductors on the surface thereof.

Mounted to the substrate surface are the actual power-handling components, specifically, transformers 72 and 74, diodes 76 and capacitors 78. These various components are secured to the substrate employing, for example, suitable adhesives, or by soldering in the case of some chips. Transformers 72 and 74 may be surface mounted, employing conventional surface mount technology.

Transformers 72 and 74 are low profile designs comprising interleaved flat copper/KAPTON polyimide windings sandwiched between slabs of ferrite. This type of low-profile transformer, and techniques for fabricating it, are generally described in commonly assigned Yerman et al. U.S. Pat. No. 5,126,715 issued Jun. 30, 1992; commonly assigned Yerman et al. application Ser. No. 07/548,468, filed Jul. 2, 1990, entitled "Single-Turn Primary and Single-Turn Secondary Flat Voltage Transformer"; Roshen et al. U.S. Pat. No. 4,862,129 issued Aug. 29, 1989; commonly assigned Yerman et al. U.S. Pat. No. 4,959,630, issued Sep. 25, 1990; and commonly assigned Yerman et al. U.S. Pat. No. 5,017,902, issued May 21, 1991. Such transformers can be made as thin as 0.1 inch.

To further reduce the height of the overall assembly, transformers 72 and 74 may be placed in suitable recesses (not shown). As another variation, components such as capacitors may be located on top of an HDI overcoat structure, as is disclosed for example in commonly assigned Wojnarowski et al. U.S. Pat. No. 5,200,810, issued Apr. 6, 1993, filed Apr. 5, 1990 entitled "High Density Interconnect Structure with Top Mounted Components".

Figure 5:
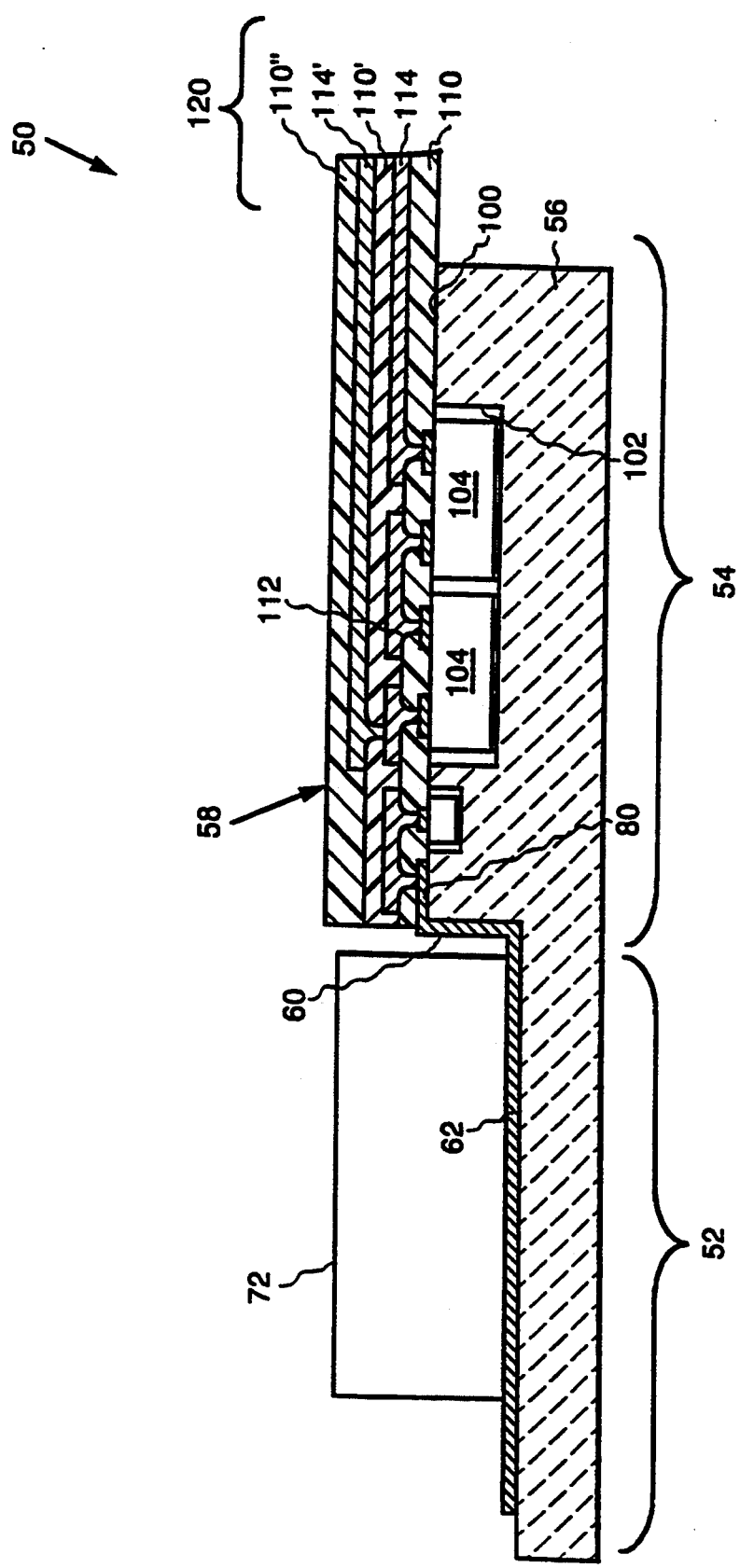
FIG. 5 is a cross section taken generally along lines 5—5 of FIGS. 2 and 3, with the HDI overcoat structure present and extended to serve as an interconnection harness.

The DBCu conductors on the power-handling portion 52 of substrate 56 extend up the step 60 to a plurality of pads 80 on the upper surface of the control element portion 54 of substrate 56, for connection to conductors, including power and ground plane layers, within HDI overcoat structure 58, as may be seen in FIG. 5.

As noted above, control element portion 54 is fabricated generally employing HDI technology. In portion 54, substrate 56 has an upper, component-supporting surface 100. Included in component-supporting surface 100 are either one large cavity (not shown) or individual cavities 102 within which various components 104, such as integrated circuit chips, switching transistors, diodes and resistors are placed. Components 104 have contact pads 106. The individual cavities 102 have appropriate depths for the various components 104.

Whether a particular component is included in power-handling portion 52 or control element portion 54 is a determination which may vary from one particular design to another. For example, primary-side power field effect transistors (FETs) may be located in control element portion 54 because they are relatively lower current devices.

Cavities 102 may be formed by starting with a bare substrate having a uniform thickness in control element portion 54 thereof, and the desired size. Conventional, laser or ultrasonic milling is used to form cavities 102 within which the various components 104 will be positioned. Where a relatively thicker or a relatively thinner component will be placed, the corresponding cavity bottom is made respectively deeper or shallower.

For the components which are not soldered, the cavity 102 bottoms are then each provided with a thermoplastic adhesive layer (not shown), which preferably is ULTEM ® polyetherimide resin available from General Electric Company, Pittsfield, Mass. The various components 104 are placed in their desired locations within cavities 102, and the entire structure is heated to the softening point of the polyetherimide (in the vicinity of 217° C. to 235° C. depending on the formulation used), and then cooled to thermoplastically bond components 104 to cavities 102.

At this stage, the upper surfaces of all components and the unmilled portions of the substrate 56 component-supporting surface 100 surrounding cavities 102 are disposed in substantially a common plane. The multi-layer high density interconnect (HDI) overcoat structure 58 (FIG. 4) is then built up to electrically interconnect the various components 104 into an actual functioning system, including making connection to the power-handling components in the portion 52 through pads 80.

To begin formation of HDI overcoat structure 58, a polyimide dielectric film 110, which may be KAPTON polyimide available from E. I. du Pont de Nemours Company, Wilmington, Del., about 0.0005 to 0.003 inch (12.5 to 75 microns) thick, is pretreated to promote adhesion and coated on one side with an ULTEM polyetherimide resin or other suitable thermoplastic (not shown) and is laminated across the top of components 104 and the substrate component-supporting surface 100. The ULTEM resin serves as a thermoplastic adhesive to hold KAPTON film 110 in place.

Via holes 112 are next laser-drilled in KAPTON film 110 and the ULTEM adhesive layers in alignment with contact pads 106 on electronic components 104 to which it is desired to make contact. Exemplary laser drilling techniques are disclosed in commonly-assigned Eichelberger et al. U.S. Pat. Nos. 4,714,516 and 4,894,115, issued Dec. 22, 1987 and Jan. 16, 1990, respectively and Loughran et al. U.S. Pat. No. 4,764,485, issued Aug. 16, 1988.

Buildup of the HDI structure continues by forming a patterned metallization layer 114 over KAPTON film layer 30 extending into via holes 112 to make electrical contact to contact pads 106 disposed thereunder. Metallization layer 114 may be patterned to form individual conductors while it is being deposited, or may be deposited as a continuous layer and then patterned using photoresist and etching. The photoresist is preferably exposed using a laser which is scanned relative to the substrate to provide an accurately aligned conductor pattern at the end of the process. Exemplary techniques for patterning the metallization layer 114 are disclosed in commonly-assigned Wojnarowski et al. U.S. Pat. Nos. 4,780,177 and 4,842,677, issued Oct. 25, 1988 and Jun. 27, 1989, respectively; and in commonly-assigned Eichelberger et al. U.S. Pat. No. 4,835,704, issued May 30, 1989. Any misposition of individual components 104 and their contact pads 106 is compensated for by use of an adaptive laser lithography system as disclosed in the aforesaid Eichelberger et al. U.S. Pat. No. 4,835,704.

Additional dielectric and metallization layers, such as dielectric layers 110' and 110'' and metallization layers 114', are formed as required in order to provide all of the desired electrical connections among components 104 and to the power-handling components via pads 80.

As may be seen in FIG. 5, HDI overcoat structure 58 extends beyond the edge of power supply substrate 56, and may conveniently be employed as a flexible multilayer interconnection harness 120. Thus the self-contained power supply 50 can be packaged alongside an HDI substrate containing logic or microwave circuitry, with interconnections between the two substrates made using the extended harness 120.

Connection pads, such as pad 80, permit input connections to be made to power supply 50, for example through conductors within HDI overcoat structure 58. As noted above, a DC input of fifty volts at 1.0 amp is typically employed.

A variety of specific approaches may be employed to connect the power supply to other substrates within a module or assembly of modules. Likewise, several techniques may be employed to make connections between the control elements of a power supply and the power handling components of a power supply.

Figure 6A:
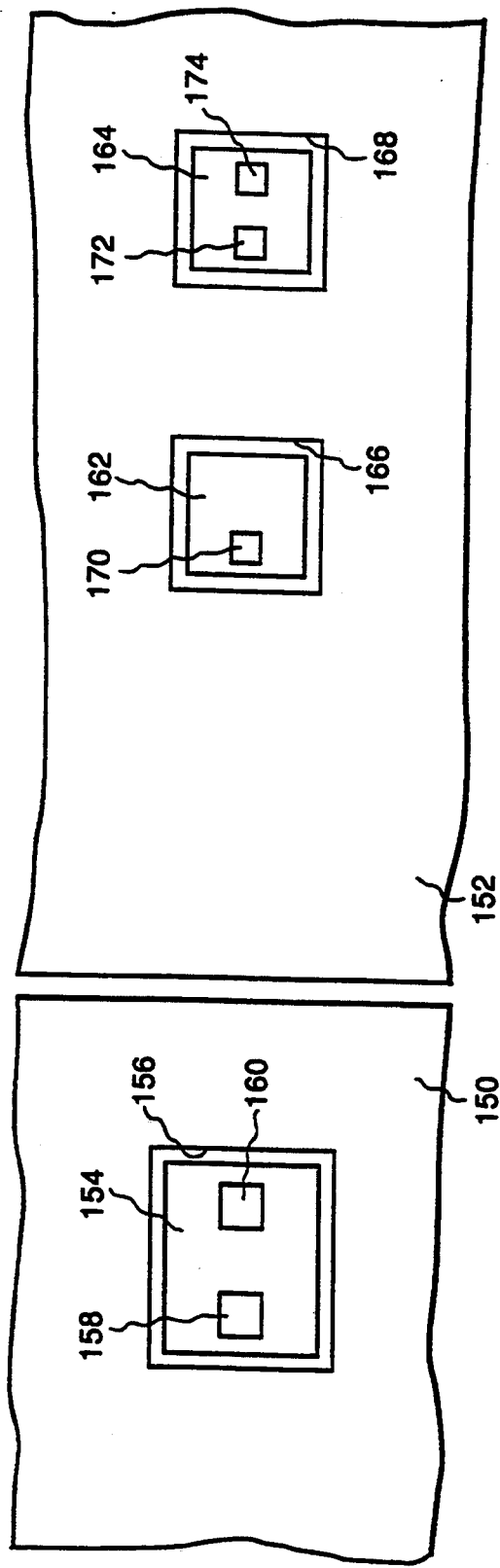
FIG. 6A is a plan view with the HDI overcoat structure omitted and FIG. 6B is a cross section with the HDI overcoat structure present, both figures depicting in general one form of interconnection between the control elements of a power supply and the power-handling components, or between a power supply substrate and another substrate, employing power and ground plane layers in the HDI overcoat structure.
Figure 6B:
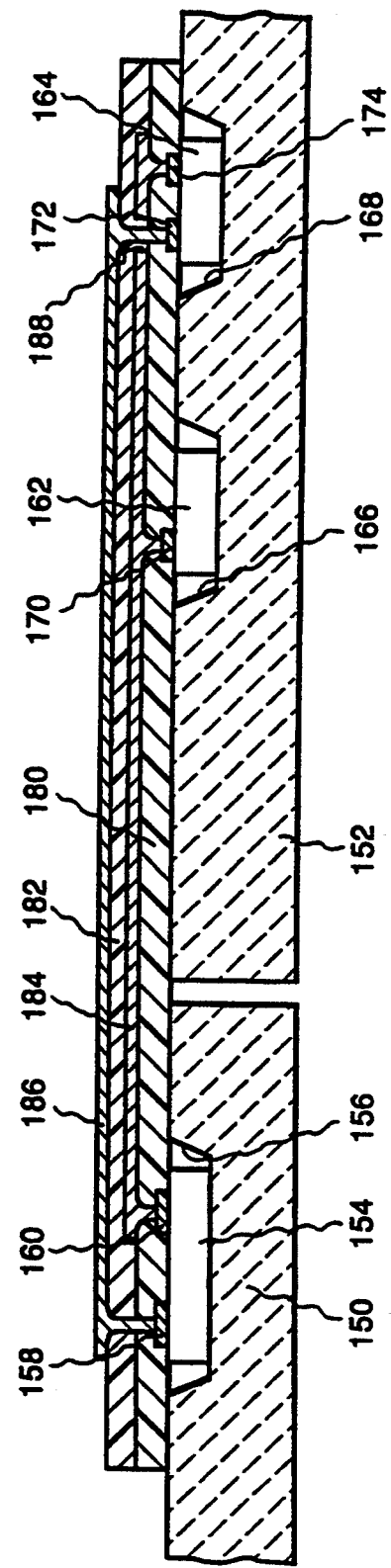

FIGS. 6A and 6B represent one form of interconnection, which may generally be described as employing an HDI overcoat for all connections. FIG. 6A is a plan view with the HDI overcoat entirely omitted for clarity of illustration, and FIG. 6B is a cross section, showing an HDI overcoat structure in place.

In FIGS. 6A and 6B there are two substrates 150 and 152, although it will be appreciated that the interconnection technique permits the two substrates 150 and 152 to be formed as a single, continuous substrate.

The choice of individual substrates or one continuous substrate may be made dependent upon a number of design considerations, including the most obvious consideration of physical size. For example, the power supply can be made smaller, but at the expense of isolation, by omitting the transformers. Another factor to consider is that having the power supply on a common substrate with processing circuitry potentially introduces more noise into the system, because power supply currents tend to flow through portions of the substrate, particularly ground plane areas. A radar module, for example, may be fabricated employing three substrates, a transmit/receive substrate, a control substrate where maintaining low noise is important, and a power supply substrate, all linked by means of an HDI harness.

In FIGS. 6A and 6B, a generalized power supply component 154 located within a recess 156 in substrate 150 has a pair of contact pads 158 and 160 on its upper surface. Substrate 152 has two generalized components 162 and 164 positioned in respective recesses 166 and 168 and having pads 170, 172 and 174 to which power supply connections are to be made.

The HDI overcoat structure is fabricated generally as described hereinabove with reference to FIG. 5, and includes KAPTON dielectric layers 180 and 182 and metallized power and ground plane layers 184 and 186. Exemplary power supply pad 160 is connected to layer 184, which arbitrarily may be considered to be a ground plane layer and which is, in turn, connected to contact pads 170 and 172 of components 162 and 164, respectively. Similarly, the other power supply contact pad 158 is connected to power plane 186, which is connected through a via to pad 172 on component 164. Ground plane layer 184 is provided with an aperture 188 through which the via connection passes without causing a short, in the same manner as is employed in conventional multi-layer circuit boards employing power and ground plane layers.

FIGS. 7A and 7B depict another form of interconnection, which employs metal zero (and can be either copper or aluminum) configured to route power from a power supply component 200 on one substrate 202 to components 204 and 206 on a separate substrate 208. In a representative arrangement, power supply component 200 is provided with terminals on the top and bottom, connected to respective metallizations 210 and 212 separated by a suitable insulating ceramic body 214. Correspondingly, metallized areas 218 and 220 are deposited directly on substrate 208, and conventional wire bonds 222 and 224 make connections between the two substrates.

An HDI overcoat structure 226 on substrate 208 as shown in FIG. 7B includes power and ground plane layers 228 and 230, respectively, which connect to the metal zero areas 218 and 220, respectively, and supply power to components 204 and 206, respectively, in the same manner as described hereinabove with reference to FIGS. 6A and 6B.

Figure 8A:
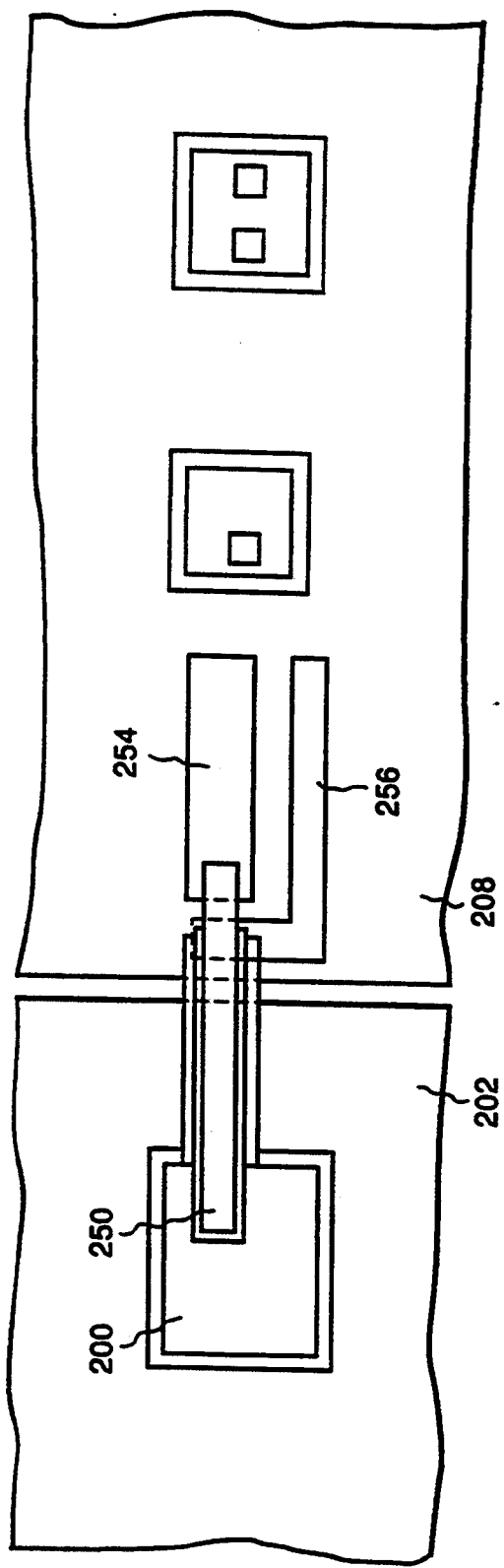
FIG. 8A is a plan view with the HDI overcoat structure omitted and FIG. 8B is a cross section with the HDI overcoat structure present, both figures depicting in general yet another form of interconnection between the control elements of a power supply and the power-handling components, or between a power supply substrate and another substrate, employing copper tabs to make connections to components.
Figure 8B:
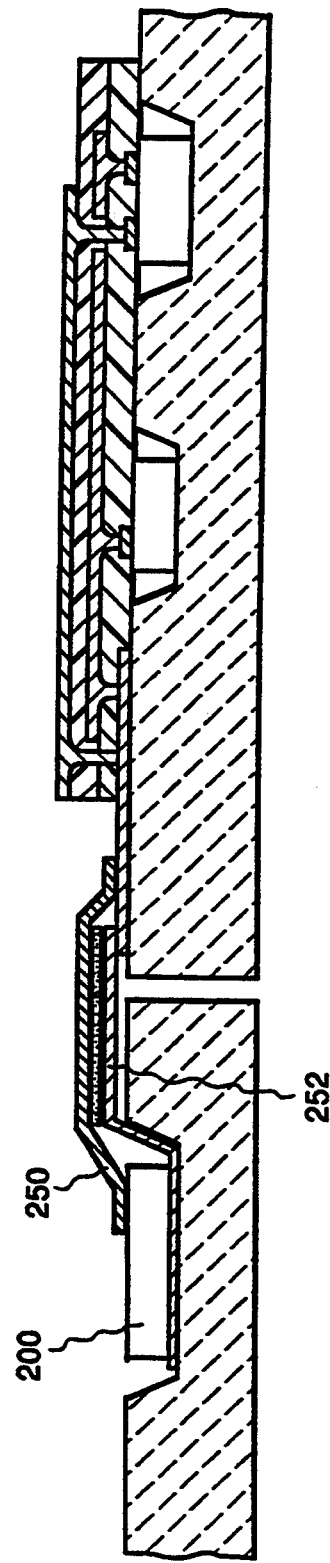

FIGS. 8A and 8B depict an intermediate approach, generally comparable to the embodiment of FIGS. 6A and 6B, but employing copper tabs 250 and 252 extending from the top and bottom of power supply component 200 to directly contact respective metal zero areas 254 and 256 on the substrate 208.

As noted hereinabove, the invention provides an MCM with a single voltage input, with multiple voltages generated internally by an embedded switching power supply. Power at different voltage levels can be distributed throughout the MCM in several ways. One technique is to employ separate metal layers within HDI overcoat structure 58 as individual power planes interleaved with ground planes, and with appropriate via positioning. Another technique is to provide multiple power distribution conductor runs on a single metal layer within the HDI overcoat structure.

Figure 9:
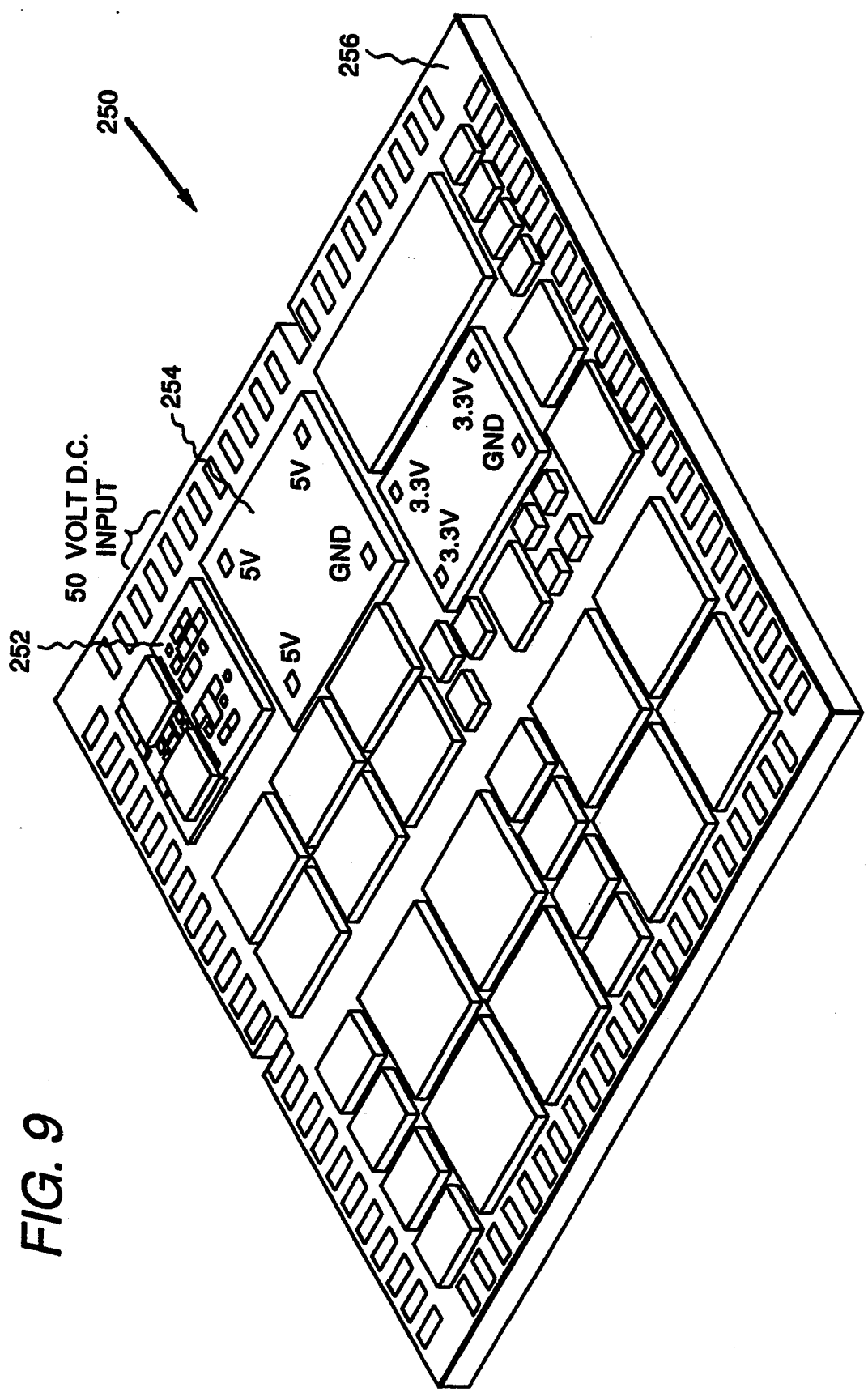
FIG. 9 is a stylized plan view, with the HDI overcoat structure omitted, of a multi-chip module employing HDI technology, with power supply elements located on the substrate.

FIG. 9 illustrates a multi-chip module 250, with the HDI overcoat omitted for purposes of illustration, including power supply elements 252 and chip components 254 all fabricated on a single substrate 256 using both DBCu and HDI technologies. As indicated, power supply 252 may have a single 50 volt DC input and may generate two voltage outputs, such as 3.3 volts and 5.0 volts in this example. The provision of a single voltage input with multiple voltages generated internally is in sharp contrast to conventional practice where multiple voltages are supplied to a MCM with chips operating at different voltages. The actual low voltage power distribution conductors are omitted from the illustration of FIG. 9. As stated above, different layers in the HDI overcoat structure can be employed for different voltages.

While specific embodiments of the invention have been illustrated and described herein, it is realized that numerous modifications and changes will accrue to those skilled in the arts. It is therefore to be understood that the appended claims are intended to cover all such modifications and changes as fall within in the true spirit and scope of the invention.

What is claimed is:

1. A high density interconnect multi-chip module comprising:
    a substrate including at least one cavity for receiving components;
    a plurality of integrated circuit chips disposed in a cavity within said substrate such that major surfaces of said chips are substantially coplanar with portions of said substrate surrounding said cavity, each of said chips having an input for power;
    a power supply disposed in a cavity within said substrate, said power supply having a power supply input and at least one power supply output, and including components for converting an input voltage and an input current to a relatively lower output voltage and a relatively higher output current;
    a multilayer interconnect structure including interleaved layers of dielectric material and conductive material disposed over said integrated circuit chips and establishing connections to said power supply components;
    means for supplying voltage and current to said power supply input from an external source; and
    low-impedance conductors connecting said power supply output to said chip power inputs.

2. A high density interconnect multi-chip module in accordance with claim 1, wherein said power supply elements include a plurality of power supply outputs.

3. A high density interconnect multi-chip module in accordance with claim 1, wherein said low-impedance conductors comprise copper strips bonded to said substrate.

4. A high density interconnect multi-chip module in accordance with claim 3, wherein said copper strips are direct bonded to said substrate.

5. A high density interconnect multi-chip module in accordance with claim 1, wherein said low-impedance conductors are included within said multilayer interconnect structure.

6. A high density interconnect multi-chip module in accordance with claim 3, wherein said low-impedance conductors are included within said multilayer interconnect structure.

7. A high density interconnect multi-chip module in accordance with claim 1, wherein said multi-chip module further comprises:
    said power supply having a power component portion having power-handling components mounted thereon and a control element portion having control elements mounted thereon and copper strip conductors bonded at least to said substrate in a pattern for establishing electrical connections, said power-handling components being electrically connected to said copper strip conductors; and
    where said interleaved layers of said multilayer interconnect structure being disposed over control elements and over at least portions of said copper strip conductors for establishing electrical connections between said power handling components and said control elements in a manner to enable said power supply to convert an input voltage and an input current to a relatively lower output voltage and a relatively higher output current.

* * * * *